United States Patent [19]

Yoshimura et al.

[11] Patent Number: 4,577,286

[45] Date of Patent: Mar. 18, 1986

[54] SOLAR ENERGY-POWERED CALCULATOR OR THE LIKE

[75] Inventors: Yutaka Yoshimura; Masahiro Hikami, both of Nara, Japan

[73] Assignee: Sharp Kabushiki Kaisha, Japan

[21] Appl. No.: 568,073

[22] Filed: Jan. 4, 1984

[30] Foreign Application Priority Data

Jan. 8, 1983 [JP] Japan .................................. 58-875[U]
Feb. 1, 1983 [JP] Japan .................................. 58-15840

[51] Int. Cl.4 .......................... G06F 1/00; H01L 31/04
[52] U.S. Cl. ..................................... 364/708; 136/257; 136/291; 364/705; 368/205
[58] Field of Search ....................... 136/251, 257, 291; 320/2; 364/705, 707, 708; 368/205

[56] References Cited

U.S. PATENT DOCUMENTS

| | | | |
|---|---|---|---|
| 3,509,712 | 5/1970 | Grohoski | 368/64 |
| 3,747,327 | 7/1973 | Uchiyama | 368/204 |
| 4,095,217 | 6/1978 | Tani et al. | 340/765 |
| 4,183,628 | 1/1980 | Laesser et al. | 350/338 |

Primary Examiner—Aaron Weisstuch
Attorney, Agent, or Firm—Birch, Stewart, Kolasch & Birch

[57] ABSTRACT

Disclosed is a solar cell-powered calculator or the like which features an integrated unit comprising solar cells and a protective filter which provides easier handling and minimum damage to the solar cells during handling processes. Such a solar cell-powered appliance easily implements electrical connection either between the solar cells themselves or between solar cells and peripheral electronic parts merely by placing the cell-filter integrated unit inside the cabinet in a simple process. In addition, such an advantageous configuration makes it possible to replace the solar cells using an extremely simple process.

3 Claims, 8 Drawing Figures

SOLAR ENERGY-POWERED CALCULATOR OR THE LIKE

BACKGROUND OF THE INVENTION

The present invention relates to a solar energy-powered electronic appliance, more particularly, to a structure related to the installation of a solar cell.

Conventionally, any electronic appliance, for example, a solar energy-powered calculator is based on a structure in which a solar cell is either adhered to a chassis composed of a metal frame or plastic material, or is secured to a chassis via a spring. A filter composed of transparent plastic material, for example, acrylic resin, is applied in order to effectively protect said solar cell and improve the unit appearance as well.

Generally, any existing electronic appliance powered by a solar cell, for example, a table-top calculator using a solar cell, said solar cell is installed in the manner shown in FIG. 1. Specifically, a filter 1 made of an acrylic sheet is installed in the upper cabinet 2 which mounts a solar cell 3 behind said filter 1, thereby maintaining said solar cell 3 in position, in cooperation with pressure exerted by holder sheet 4. Solar cell 3 is then either soldered via lead wires to a circuit board 6 which is composed of a flexible film, on which an LSI chip 5 is mounted, or is electrically connected to said circuit board via a connector terminal 7.

Reference numbers 8 indicate an LCD display cell and 9 a conductive elastic rubber, for example, "ZEBRA" rubber, that enables said LCD display cell 8 and circuit board 6 to be electrically connected. However, according to such a conventional means used for installing said solar cell 3, since filter 1 and solar cell 3 are independently stored in the cabinet 2, said solar cell 3 cannot easily be set in position and requires a holder sheet 4 for securing the cell 3. In addition, due to very complex cabinet configurations, delicate procedures are needed for orderly assembly of peripheral parts. Such a conventional electronic calculator structurally requires both the solar cell 3 and an electronic part, for example, LSI chip 5 to be electrically connected to each other, thus making it necessary to either solder said solar cell 3 to the circuit board 6 via lead wires or to connect connector terminal 7 to the electrodes of cell 3 and the circuit board 6. As a result, when replacing said solar cell 3 due to damage or any other reasons, peripheral parts such as the holder sheet 4, connector terminal 7, and others must also be disassembled from the unit.

OBJECT AND SUMMARY OF THE INVENTION

The present invention aims at eliminating such disadvantages thus far described. In particular, by mounting the solar cell directly onto the protection filter, parts that are conventionally needed for any existing appliance including the frame and chassis have been deleted.

The present invention also aims at providing an extremely economical solar cell powered calculator by simplifying the internal configuration so as to reduce cost. Also, by integrating the solar cell with the protection filter as a unit, assembly as well as the cell positioning operation can be very easily done during the production process.

A still further object of the present invention is to provide a device for connecting a solar cell by integrating both the solar cell and its protection filter to ensure easier handling and minimum damage to the solar cell, and yet, since the cell-filter integrated unit can be easily installed in the cabinet by a simple operation, electrical connection between either the electrodes of the solar cell itself or between the solar cell and peripheral electronic parts can be easily achieved, while such a simplified configuration provides an extremely easy procedure for replacing the solar cell itself.

The present invention has embodied a structure in which a solar cell is directly installed to the protection filter, thus making it possible to delete structural parts such as the frame and chassis conventionally needed for mounting a solar cell and also considerably reduces the number of required peripheral parts while the embodied cell-filter integrated unit provides significant advantages in handling convenience, assembly, and accurate positioning of this unit against the cell window portion. In addition, the simplified strucure of the cell-filter integrated unit provides still further advantages in that both electrodes of said solar cell or the cell unit and peripheral electronic parts can be electrically connected to each other very easily by merely setting said unit inside the cabinet via a simple process, and yet, the solar cell itself can be replaced very easily as required.

DETAILED DESCRIPTION OF THE INVENTION

Figure 1:
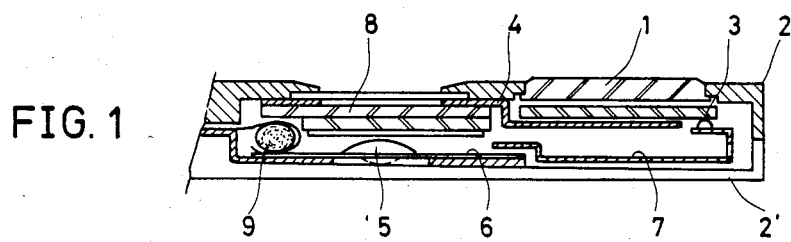
FIG. 1 is a sectional view of an electronic appliance showing a conventional solar cell installation method.
Figures 2, 3:
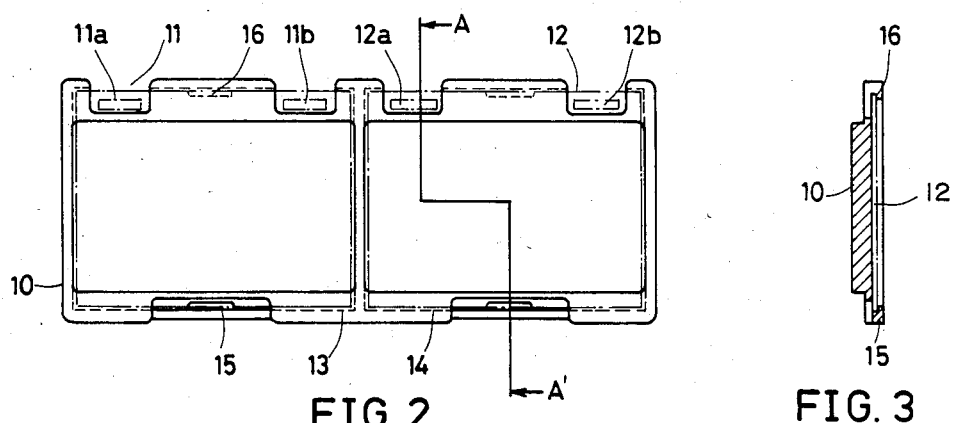
FIG. 2 is a planar view of a solar cell-protection filter integrated unit as a preferred embodiment of the present invention.
FIG. 3 is a sectional view across points A and A' of the solar cell-filter integrated unit.

FIG. 2 is a plan view of a solar cell-filter integrated unit. FIG. 3 is a sectional view across points A and A' of the solar cell-filter integrated unit. Reference numer 10 indicates a filter made of transparent plastic material, for example, acrylic resin, protecting the solar cell. Reference numbers 11 and 12 respectively show a solar cell made of amorphous silicon, while the preferred embodiment in the drawings shows two individual solar cells being connected in series. Solar cell 11 contains two electrodes, 11a and 11b. Likewise, solar cell 12 also contains 2 electrodes 12a and 12b. In the preferred embodiment, electrode 11a of the solar cell 11 is connected to the positive terminal of an electronic part, for example, an LSI chip that is installed to the circuit board, for example, made of a flexible film, whereas electrode 12b of the solar cell 12 is connected to the negative terminal of said LSI chip, while electrodes 11b and 12a of the solar cells 11 and 12 are short-circuited, thus connecting the cell electrodes in series. Solar cells 11 and 12 are respectively installed either into positioning grooves provided in protection filter 10 or in the coupling parts 13 and 14. Solar cells 11 and 12 are further fixed in position by being pressed by elastic under-cut portions 15 and 16 that are integrally molded with filter 10, thus forming an integral unit by securing solar cells 11 and 12 into said filter 10.

Figures 4A, 4B, 4C:
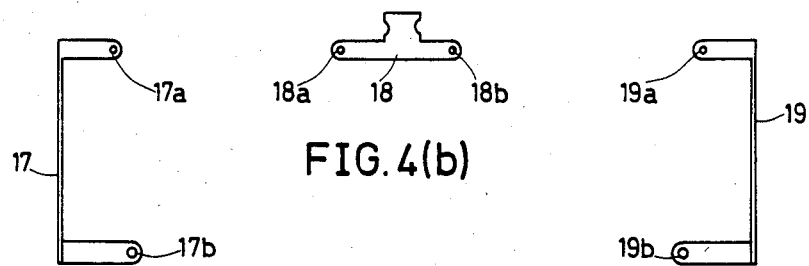
FIGS. 4(a) through (c) respectively show the terminals used for the connectors of said solar cell.

FIGS. 4(a) through (c) respectively show a planar view of the form and structure of the connector terminals. FIGS. 4(a) and 4(c) show terminals connecting the cell electrodes and peripheral electronic parts, while FIG. 4(b) shows a terminal shorting solar cells 11 and 12. As described later on, terminal 17 connects electrode 11a of solar cell 11 and the positive terminal of an LSI chip on the circuit board, wherein contact 17a is in contact with electrode 11a, and contact 17b is in contact with the contact of said circuit board. Terminal 18 connects electrodes 11b and 12a of solar cells 11 and 12. Terminal 19 causes both electrode 12b of cell 12 and the negative terminal of an LSI chip on the circuit board to come into contact with contacts 19a and 19b. The preferred embodiment of the present invention provides terminals 17 through 19 for extracting power from the solar cells, with the feature that solar cells can be accurately set in position for actual service merely by installing an integrated unit comprising said filter 10 as the base plus solar cells 11 and 12 secured to it.

Figure 5:
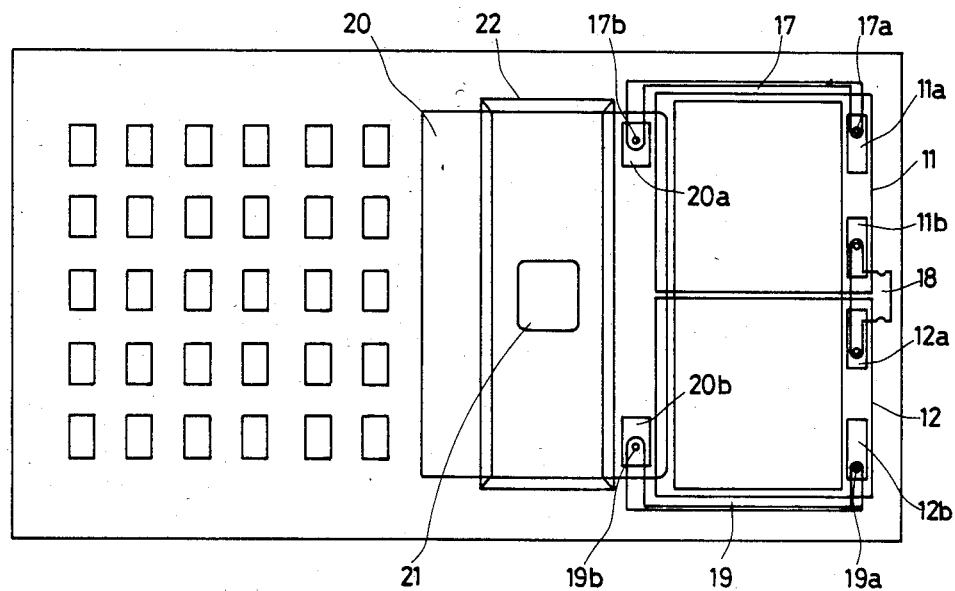
FIG. 5 is a plan view of a table-top calculator using the solar cell connectors as a preferred embodiment of the present invention.
Figure 6:
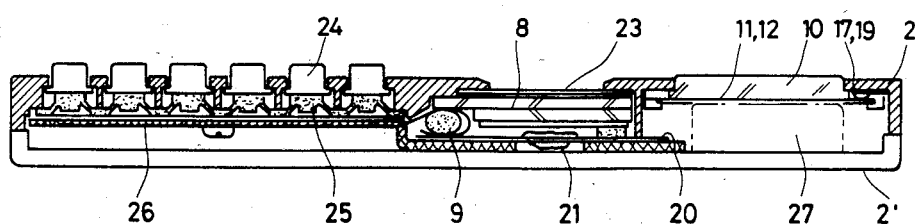
FIG. 6 is a section view of a table-top calculator shown in FIG. 5.

Such a configuration is shown in both the planar view of FIG. 5 and the sectional view of FIG. 6. Reference number 20 denotes a circuit board composed of a flexible film, on which an LSI chip 21 is mounted securely. Reference number 22 denotes a display window. Terminals 17, 18, and 19 are respectively positioned inside the cabinet. When said filter 10 incorporating solar cells 11 and 12 is placed inside the cabinet, terminal 17 causes electrode 11a of solar cell 11 to be electrically connected to the positive electrode 20a of LSI chip 21 on the circuit board 20. Conversely, terminal 19 causes electrode 12b of solar cell 12 to be electrically connected to the negative electrode 20b of LSI chip 21 on the circuit board 20. Terminal 18 functions to cause electrodes 11b and 12a of solar cells 11 and 12 to be connected to each other so that two solar cells can be connected in series. Reference number 22 is a display window, while 23 denotes a Polaroid® filter and a display mask. Reference number 24 denotes a key top, 25 a rubber spring, and 26 a key seat, respectively. Reference number 27 denotes a projection part holding solar cells 11 and 12 that may be either jointly or independently inserted into the lower cabinet 2' when the undercut portions 15 and 16 shown in FIG. 2 are not provided for holding solar cells in said filter 10. As clear from the above description, by internally providing connector terminals 17 through 19 inside the cabinet structure in advance, solar cells can be easily and effectively replaced or reinstalled by simply setting or removing the unit integrating both the filter base and solar cells.

The present invention thus described in reference to the annexed drawings may be suggestive of any derivation or modification by those skilled in the arts. However, it should be understood that the present invention is not limitative of the spirit and scope described above, but intended to solely include all deviations and/or modifications within the spirit and scope of the following claims.

What is claimed is:

1. An electronic calculator containing a plurality of solar cells powering the internally provided electronic parts comprising;

a removable integrated unit comprising said solar cells, a protective filter, and support means for securing said solar cells to the filter;

a plurality of terminals present in said appliance for obtaining the power generated by said solar cells; and means for achieving electrical connections either between said solar cells or between said solar cells and said electronic parts upon installing said integrated unit into said electronic appliance.

2. An electronic calculator as recited in claim 1:

wherein said support means comprises molded securing means connected to ends of the filter for directly securing said protective filter to said solar cells.

3. An electronic calculator as recited in claim 2 wherein said support means further includes positioning grooves in said protective filter for securing said solar cells.

* * * * *